United States Patent [19]
Kitou et al.

[11] Patent Number: 5,952,679
[45] Date of Patent: Sep. 14, 1999

[54] SEMICONDUCTOR SUBSTRATE AND METHOD FOR STRAIGHTENING WARP OF SEMICONDUCTOR SUBSTRATE

[75] Inventors: Yasuo Kitou, Okazaki; Eiji Kitaoka, Anjo; Takamasa Suzuki, Nagoya; Mitsuhiro Kataoka, Kariya, all of Japan

[73] Assignee: Denso Corporation, Kariya, Japan

[21] Appl. No.: 08/951,646

[22] Filed: Oct. 16, 1997

[30] Foreign Application Priority Data

Oct. 17, 1996 [JP] Japan .................................. 8-275129
Oct. 17, 1996 [JP] Japan .................................. 8-275133

[51] Int. Cl.⁶ ............................................. H01L 31/0312
[52] U.S. Cl. .................................. 257/77; 257/622
[58] Field of Search .......................... 257/77, 622, 627, 257/628

[56] References Cited

U.S. PATENT DOCUMENTS

| | | | |
|---|---|---|---|
| 3,566,204 | 2/1971 | Callahan | 317/230 |
| 4,859,621 | 8/1989 | Einthoven . | |
| 5,170,231 | 12/1992 | Fujii et al. . | |
| 5,233,215 | 8/1993 | Banival . | |
| 5,399,515 | 3/1995 | Davis et al. . | |
| 5,506,421 | 4/1996 | Palmour . | |

FOREIGN PATENT DOCUMENTS

| | | |
|---|---|---|
| 57-99752 | 6/1982 | Japan . |
| 58-197729 | 11/1983 | Japan . |
| 2-215121 | 8/1990 | Japan . |
| 4-209522 | 7/1992 | Japan . |
| 4-239778 | 8/1992 | Japan . |
| 7-86199 | 3/1995 | Japan . |
| 7-131016 | 5/1995 | Japan . |
| 7-326755 | 12/1995 | Japan . |
| 8-70124 | 3/1996 | Japan . |
| 8-107223 | 4/1996 | Japan . |

OTHER PUBLICATIONS

Proceedings of the 28th Intersociety Energy Conversion Engineering Conference, IECEC–93 Aug. 8–13, 1993 pp. 1249–1254.
Current–Voltage and Capacitance–Voltage Characteristics of Metal/Oxide/6H–Silicon Carbide Structure, JPN. J. Appl. Phys., vol. 34(1995) pp. 5567–5573 Part 1, No. 10, Oct. 1995.
Silicon Carbide and Related Materials Proceedings of the Fifth Conference 1–3 Nov. 1993, Washington, DC. USA, Institute of Physics Conference Series Number 137, Institute of Physics Publishing, Bristol and Philadelphia, pp. 54–58.

*Primary Examiner*—Sara Crane
*Attorney, Agent, or Firm*—Pillsbury Madison & Sutro LLP

[57] ABSTRACT

A plurality of grooves are formed in a SiC substrate consisting of an $n^-$-type epitaxial layer and a p-type epitaxial layer layered on the surface of an $n^+$-type monocrystalline SiC semiconductor substrate. These grooves are formed in a grid on the SiC substrate. Heat treatment is then carried out to straighten warp of the SiC substrate caused by the growth of the epitaxial layers.

9 Claims, 6 Drawing Sheets

↑ <11$\bar{2}$0>
→ <1$\bar{1}$00>

FIG.14C ously in the face of the present invention, to reduce the warp
SEMICONDUCTOR SUBSTRATE AND METHOD FOR STRAIGHTENING WARP OF SEMICONDUCTOR SUBSTRATE

CROSS REFERENCE TO RELATED APPLICATION

This application is based upon and claims the benefit of priority of prior Japanese Patent Applications No. H. 8-275129 filed on Oct. 17, 1996 and No. 8-275133 filed on Oct. 17, 1996, the contents of which are incorporated by reference.

BACKGROUND OF THE INVENTION

1. Field of the Invention

This invention relates to a semiconductor substrate, such as a silicon carbide substrate made by forming an epitaxial layer on a semiconductor layer, having had its warp straightened; a method for straightening warp of a semiconductor substrate; and a method for manufacturing a silicon carbide semiconductor device using a silicon carbide substrate having had its warp straightened.

2. Related Art

Figure 13:
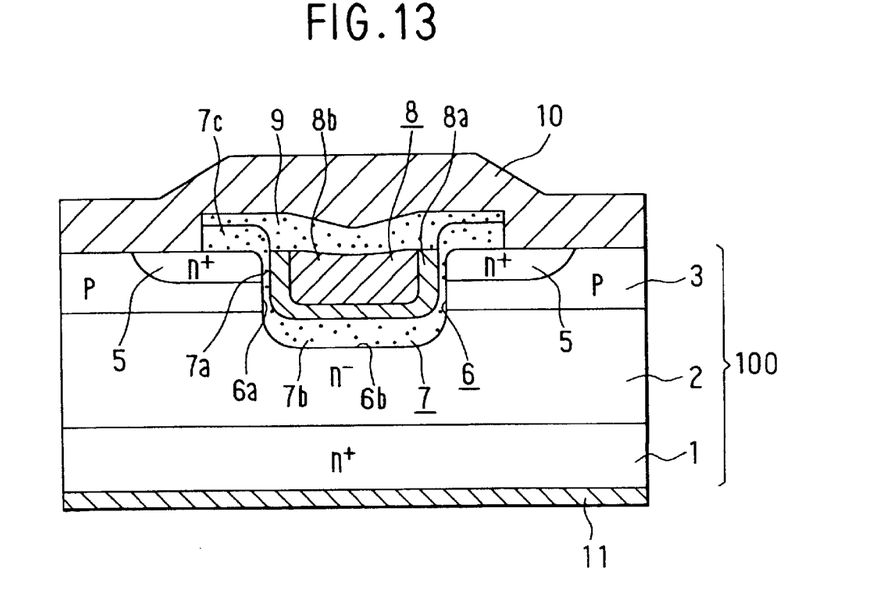
FIG. 13 is a sectional view of a SiC power MOSFET.

The use of a silicon carbide (hereinafter abbreviated to SiC) semiconductor device as a trench gate type SiC power MOSFET is disclosed in Japanese Patent Application Laid-open No. H.7-326755 and Japanese Patent Application Laid-open No. H.8-70124. This SiC power MOSFET has excellent characteristics such as low on-resistance and high withstand voltage. Its sectional construction is shown in FIG. 13.

A SiC substrate 100 is made by successively forming an n$^-$-type epitaxial layer (high-resistance layer) 2 and a p-type epitaxial layer 3 on a hexagonal system n$^+$-type monocrystalline SiC semiconductor substrate (low-resistance semiconductor layer) 1 whose surface plane orientation is (000$\bar{1}$) carbon face.

An n$^+$ source region 5 constituting a semiconductor region is formed in the p-type epitaxial layer 3. Also, a trench 6 passing through the n$^+$ source region 5 and the p-type epitaxial layer 3 and reaching the n$^-$-type epitaxial layer 2 is formed. Inside the trench 6 a gate thermal oxide film 7 is formed and on that a gate electrode layer 8 (8a, 8b) is formed. Also, a source electrode layer 10 constituting a first electrode layer is formed on an interlayer insulating film 9, the surface of the n$^+$ source region 5 and the surface of the p-type epitaxial layer 3, and a drain electrode layer 11 constituting a second electrode layer is formed on the back surface of the semiconductor substrate 1.

In the construction described above, the surface of the p-type epitaxial layer 3 on the side surface 6a of the trench 6 is a channel region. When a positive voltage is impressed on the gate electrode 8 and a channel is formed, a current flows between the source and the drain.

However, when a thin film of epitaxial layer (epitaxial growth film) is deposited on the semiconductor substrate, internal stress arising at the time of formation of the epitaxial layer causes the substrate to warp. Due to this kind of warp, deviation occurs in mask alignment of when manufacturing a semiconductor device. In particular, the problem of warp becomes more serious as the size of the semiconductor substrate becomes large. According to experiments carried out by the present inventors, the problem of mask misalignment caused by warp of the SiC substrate 100 becomes serious when the diameter of the SiC substrate 100 is one inch or more.

SUMMARY OF THE INVENTION

It is therefore an object of the invention to reduce the warp of a semiconductor substrate having an epitaxial layer.

To achieve this object and other objects, in a semiconductor substrate made by forming an epitaxial layer on a semiconductor layer, before a semiconductor element is formed on the semiconductor substrate, a groove is formed in the surface of the epitaxial layer. Thereafter, the warp of the semiconductor substrate is straightened by heat treatment being carried out.

That is, because internal stress arising at the time of formation of the epitaxial layer is relieved by the heat treatment following the formation of the groove, it is possible to obtain a semiconductor substrate having had its warp straightened. The warp-straightening effect can be increased by forming multiple grooves.

Also, the invention can be applied to a SiC substrate whose surface plane orientation is about (000$\bar{1}$) carbon face. In this case, a SiC substrate having had its warp straightened can be obtained. In this case, the grooves can be made in a rectangular grid formed in the directions <1$\bar{1}$00> and <11$\bar{2}$0> or made hexagonal. When the grooves are made in a grid, they can be made to double as scribe lines for dicing semiconductor chips.

When the semiconductor layer and the epitaxial layer have a 4H-type crystalline structure, compared to when they have a 6H-type crystalline structure, the warp-straightening effect is greater.

Also, the invention can be applied to a SiC substrate made by forming an epitaxial layer of a first conductive type and an epitaxial layer of a second conductive type on a semiconductor layer of the first conductive type wherein the surface plane orientation of the epitaxial layer of the second conductive type is about (000$\bar{1}$) carbon face. In this case also it is possible to obtain a SiC substrate having had its warp straightened.

A SiC substrate formed in this way can be used in the manufacture of a SiC semiconductor device such as a SiC power MOSFET.

In particular, if the grooves are made of a depth such that they pass through the epitaxial layer of the second conductive type and reach the epitaxial layer of the first conductive type, it is possible to carry out straightening of the warp fully.

As well as grooves being formed in the surface of the semiconductor substrate, the edges of the semiconductor substrate may be chamfered off before heat treatment is carried out to straighten the warp of the semiconductor substrate. By chamfering the edges of the semiconductor substrate in addition to forming the grooves it is possible to straighten the warp of the semiconductor substrate even more effectively.

When manufacturing a SiC semiconductor device such as the above-mentioned SiC power MOSFET, the heat treatment carried out to straighten the warp of the SiC substrate is preferably carried out at a higher temperature than the temperatures of all subsequent processes. If this is done, when a semiconductor device is formed using the SiC substrate having had its warp straightened, the warp of the SiC substrate remains straightened and problems of mask misalignment do not arise.

Also, when a SiC substrate formed as described above is used to manufacture a SiC semiconductor device, preferably, after a dopant is ion-implanted into the SiC substrate, an epitaxial film is formed on the surface of the SiC substrate and activation annealing is carried out with this epitaxial film as a cap film. By carrying out activation annealing with an epitaxial film as a cap film, because the cap film does not decompose even when the substrate temperature is raised above 1300° C., it is possible to obtain an ample carrier density by the activation annealing.

Also, after a dopant is ion-implanted into the SiC substrate, activation annealing may be carried out while an epitaxial film is being formed on the surface of the SiC substrate. In this case, because it is possible to carry out activation annealing simultaneously with the formation of the epitaxial film, the same effects as those described above can be obtained in a single step. Specifically, activation annealing is carried out with the SiC substrate brought to a temperature higher than 1300° C. and with $SiH_4$, $C_3H_8$ being passed over it.

Also, when a semiconductor region is a region to be in ohmic contact with an electrode layer, preferably, the epitaxial film is removed after the activation annealing is carried out. In this case, if an epitaxial film is formed on the surface of the SiC substrate to a film thickness of between 2000 Å and 3000 Å, the epitaxial film functions fully as a cap film preventing out diffusion and also can be removed easily after the activation annealing.

It is also possible to form a film of the same material as the SiC substrate on the surface of the SiC substrate after a dopant is ion-implanted into it and carry out activation annealing with this film as a cap film. Since if the film consists of the same material as the SiC substrate it does not decompose during the activation annealing, it is possible to obtain an ample carrier density as a result of the activation annealing.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PREFERRED EMBODIMENTS

A first preferred embodiment of the invention applied to a SiC power MOSFET will now be described.

Steps for manufacturing a SiC power MOSFET are illustrated in FIG. 1 through FIG. 10.

Figure 1:
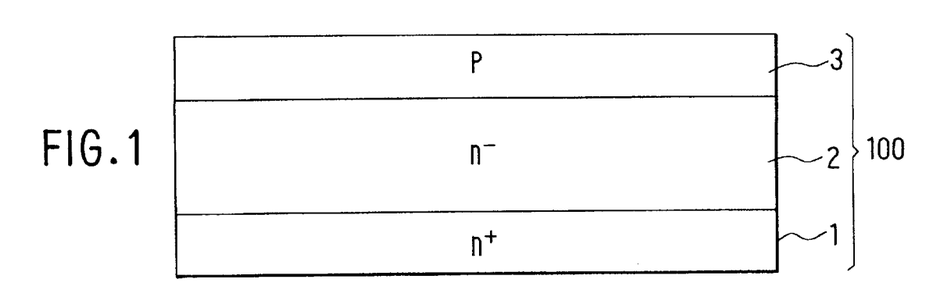
FIG. 1 is a sectional view illustrating the first step in the manufacture of a SiC power MOSFET according to a first preferred embodiment of the invention.

First, as shown in FIG. 1, an $n^-$-type epitaxial layer 2 of carrier density about $1 \times 10^{16}$ cm$^{-3}$ and thickness 3 μm to 4 μm and a p-type epitaxial layer 3 of carrier density about $1 \times 10^{17}$ cm$^{-3}$ and thickness 2 μm are successively layered on the surface of a low-resistance $n^+$-type monocrystalline SiC semiconductor substrate 1 whose surface plane orientation is (000$\bar{1}$) carbon face to form a SiC substrate (wafer) 100. In this case, because the crystal axis of the semiconductor substrate 1 is inclined at about 3.5° C. to 8° C. to an axis perpendicular to the (000$\bar{1}$) carbon face, the plane orientation of the principle surface of the p-type epitaxial layer 3 becomes about (000$\bar{1}$) carbon face. The SiC substrate 100 is one inch or more in diameter.

Treatment for straightening warp of the SiC substrate 100 is then carried out.

Figure 2A:
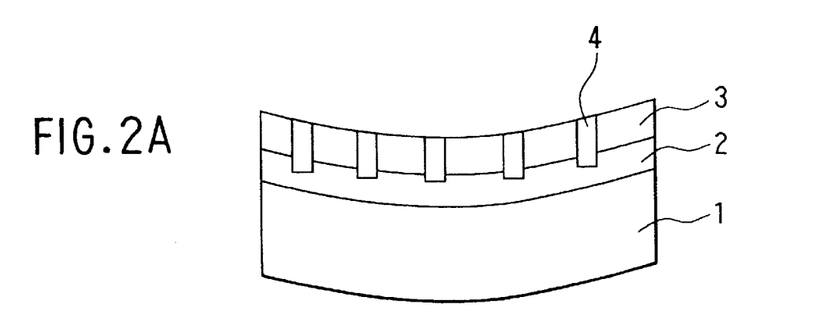
FIG. 2A is a sectional view illustrating a manufacturing step following the step of FIG. 1 of forming a plurality of grooves 4 in the surface of a SiC substrate 100.
Figure 2B:
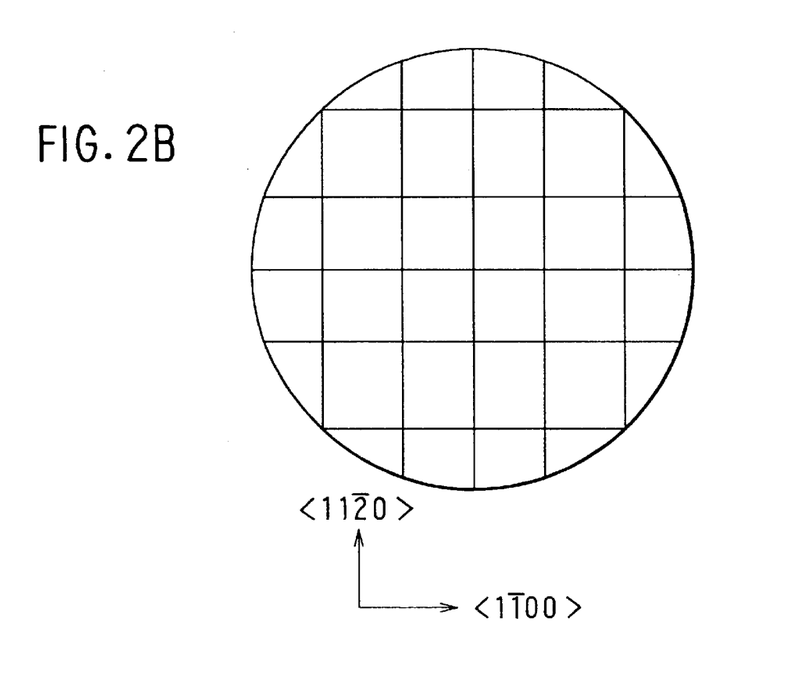
FIG. 2B is a plan view showing the grooves 4 formed in the surface of the SiC substrate 100.

First, as shown in FIG. 2A, multiple grooves 4 are formed in the surface of the SiC substrate 100 using photolithography. These grooves 4 are of width 30 μm and depth 5 μm, and as shown in FIG. 2B are formed in the <1$\bar{1}$00> and <11$\bar{2}$0> directions in a grid of spacing 5 mm. Because semiconductor chips of SiC power MOSFETs are to be formed in the regions bounded by the grooves 4, the grooves 4 can also be used as scribe lines for dicing and taking out the semiconductor chips.

Figure 3:
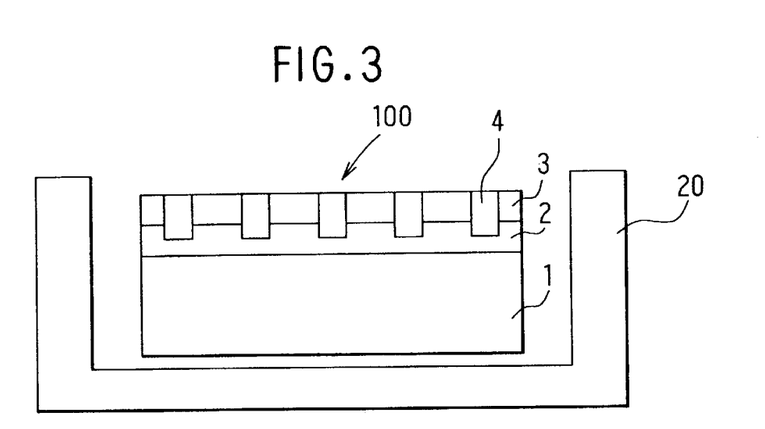
FIG. 3 is a sectional view illustrating a manufacturing step following the step of FIG. 2A of straightening warp of the SiC substrate 100 by carrying out heat treatment.

After the grooves 4 are formed, the SiC substrate 100 is placed in a heater 20 as shown in FIG. 3 and heat treated at 1500° C. for ten minutes in an argon atmosphere. Internal stress arising at the time of formation of the epitaxial layers 2 and 3 is relieved as a result of this heat treatment, the surface of the SiC substrate 100 can move easily due to the grooves 4, and the warp of the SiC substrate 100 is straightened.

After that, a MOSFET as a semiconductor element is formed on the SiC substrate 100 having had its warp straightened by the process described above.

Figure 4:
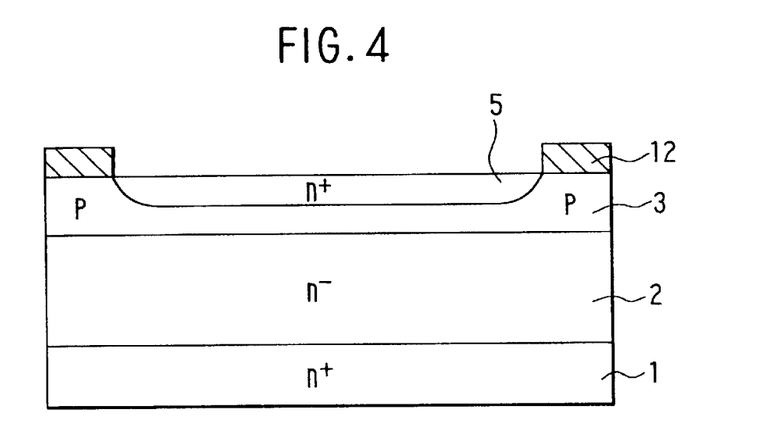
FIG. 4 is a sectional view illustrating a manufacturing step following the step of FIG. 3 of forming an $n^+$ source region 5.
Figure 5:
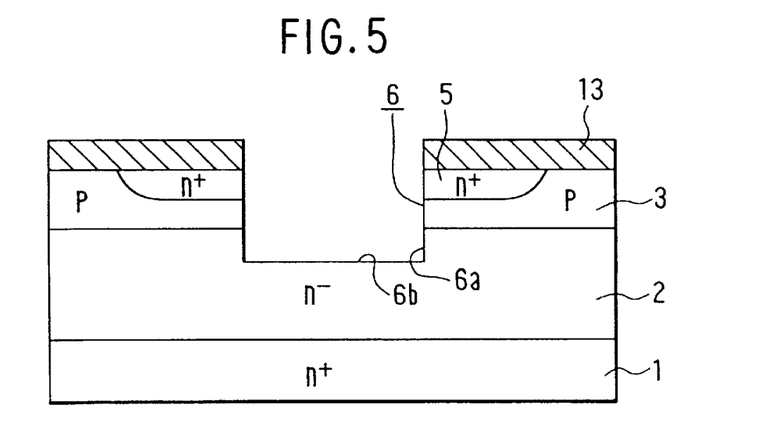
FIG. 5 is a sectional view illustrating a manufacturing step following the step of FIG. 4 of forming a trench 6.

First, as shown in FIG. 4, an $n^+$ source region 5 of surface carrier density $1 \times 10^{19}$ cm$^{-3}$ and junction depth 0.5 μm is formed by implanting ions into the p-type epitaxial layer 3 using a mask 12. The mask 12 is then removed and, as shown in FIG. 5, a trench 6 of depth 2.7 μm passing through the $n^+$ source region 5 and the p-type epitaxial layer 3 and reaching the $n^-$-type epitaxial layer 2 is formed by reactive ion etching (RIE) using a mask 13. This trench 6 has a side surface 6a perpendicular to the surface of the p-type epitaxial layer 3 and a bottom surface 6b parallel with the surface of the p-type epitaxial layer 3.

In this SiC power MOSFET, because when the channel face is made (11$\bar{2}$0) face the leak current is a minimum, the side surface 6a of the trench 6 is extended in about the <11$\bar{2}$0> direction.

Figure 6:
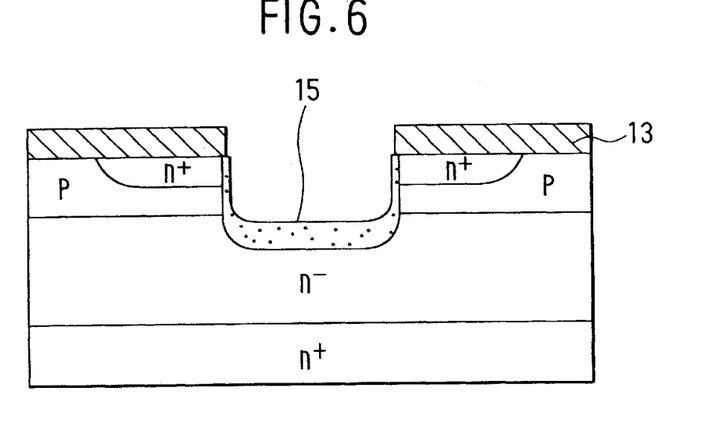
FIG. 6 is a sectional view illustrating a manufacturing step following the step of FIG. 5 of forming a sacrificial oxide film 15.

After that, as shown in FIG. 6, a thermal oxide film 15 as a sacrificial oxide film is formed on the trench inner wall by carrying out thermal oxidation at 1100° C. for about 5 hours. As a result of this thermal oxidation, a damaged layer on the trench inner wall formed in the RIE is oxidized. The thermal oxide film 15 is of thickness 50 nm on the side surface 6a of the trench 6 and of thickness 500 nm on the bottom surface 6b of the trench 6.

Figure 7:
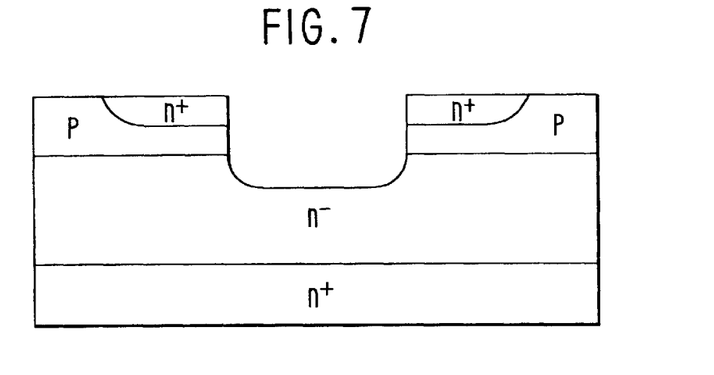
FIG. 7 is a sectional view illustrating a manufacturing step following the step of FIG. 6 of removing the sacrificial oxide film 15.

Then, as shown in FIG. 7, after this thermal oxide film 15 is removed with hydrofluoric acid, the mask 13 is removed. As a result of this thermal oxide film 15 being removed, the damaged layer on the trench inner wall is removed.

Figure 8:
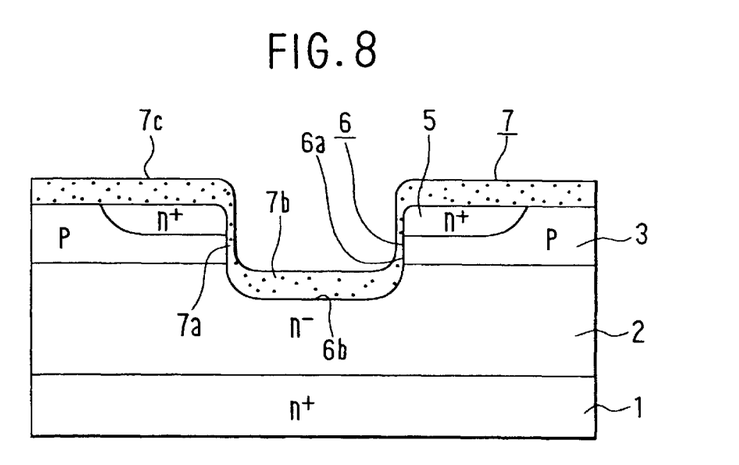
FIG. 8 is a sectional view illustrating a manufacturing step following the step of FIG. 7 of forming a gate thermal oxide film 7.

Next, as shown in FIG. 8, a gate thermal oxide film 7 is formed by a single thermal oxidation step of 1100° C. for about 5 hours, and as a result of this thermal oxidation a thin gate thermal oxide film 7a of thickness 50 nm disposed on the side surface 6a of the trench 6 and a thick thermal oxide film 7b of thickness 500 nm disposed on he bottom surface 6b of the trench 6 are formed. Also, a thick gate oxide film 7c of thickness 500 nm is formed on the n$^+$ source region 5.

Figure 9:
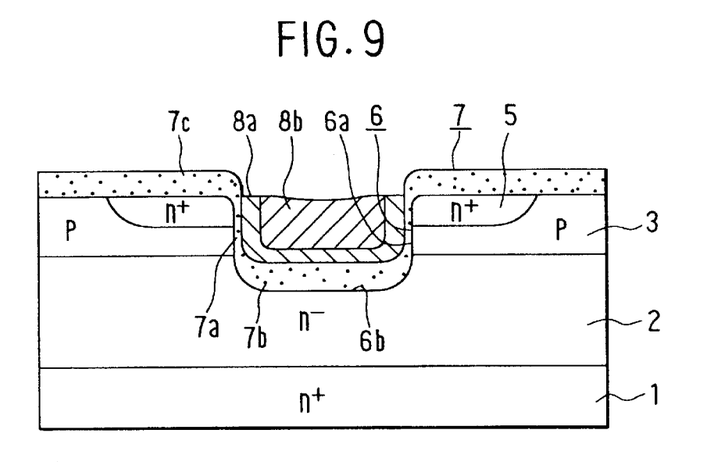
FIG. 9 is a sectional view illustrating a manufacturing step following the step of FIG. 8 of forming a gate electrode layer 8 (8a, 8b)
Figure 10:
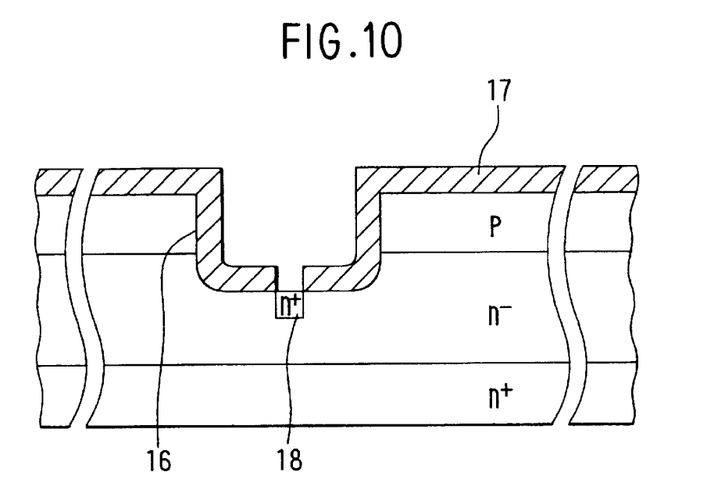
FIG. 10 is a sectional view illustrating a step of forming a guard ring 18.

Then, as shown in FIG. 9, first and second polysilicon layers 8a, 8b are successively filled into the trench 6.

After that, an interlayer insulating layer 9 is formed by CVD on the gate thermal oxide film 7 including the first and second polysilicon layers 8a, 8b. Then, the gate thermal oxide film 7 and the interlayer insulating layer 9 on the surface of the n$^+$ source region 5 and the p-type epitaxial layer 3 where a source contact is to be located are removed. A source electrode layer 10 is then formed on the n$^+$ source region 5, the p-type epitaxial layer 3 and the interlayer insulating layer 9, a drain electrode layer 11 is formed on the back surface of the semiconductor substrate 1, and the SiC power MOSFET shown in FIG. 13 is thereby completed.

The SiC power MOSFET described above is formed integrated in a cell region, and a guard ring is formed around that cell region. This guard ring is formed in the following way. At the periphery of the cell region shown in FIG. 10, at the time of formation of the trench 6 shown in FIG. 5, a groove 16 is formed simultaneously. Then, after the formation and removal of the sacrificial oxide film 15 shown in FIG. 6 and FIG. 7, a mask 17 is formed and ion implantation is carried out and then the mask 17 is removed and heat treatment is carried out at 1300° C. to form a guard ring 18.

The heat treatment temperature of 1300° C. for forming this guard ring 18 is the highest temperature among the process temperatures of the steps illustrated in FIG. 4 onward. However, because the heat treatment temperature for the warp-straightening illustrated in FIG. 3 is even higher than this, the warp of the SiC substrate 100 remains straightened throughout the steps of FIG. 4 onward. Consequently, in the steps of FIG. 4 onward, problems of mask misalignment do not arise. As the temperature of the heat treatment for the warp-straightening illustrated in FIG. 3, a temperature between 1300° C. and 2000° C. is preferable.

Figure 11:
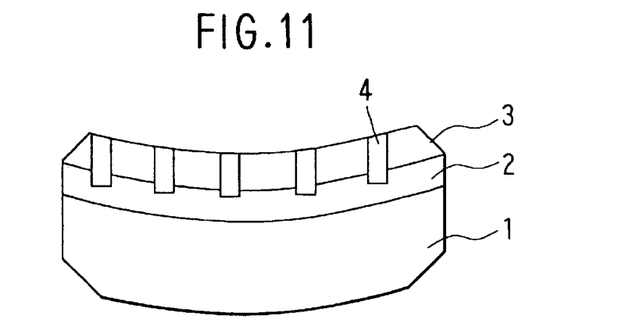
FIG. 11 is a sectional view illustrating another version of the step shown in FIG. 2A.

The first preferred embodiment described above shows an example wherein grooves 4 are formed in the SiC substrate 100 before warp-straightening is carried out. However, as shown in FIG. 11, in addition to the formation of the grooves 4, the edges of the upper and lower faces of the SiC substrate 100 may be chamfered (edge-ground to C0.5 mm) before the heat treatment of FIG. 3 is carried out to straighten the warp. By carrying out this chamfering, the straightening of the warp can be carried out still more effectively.

Figure 12:
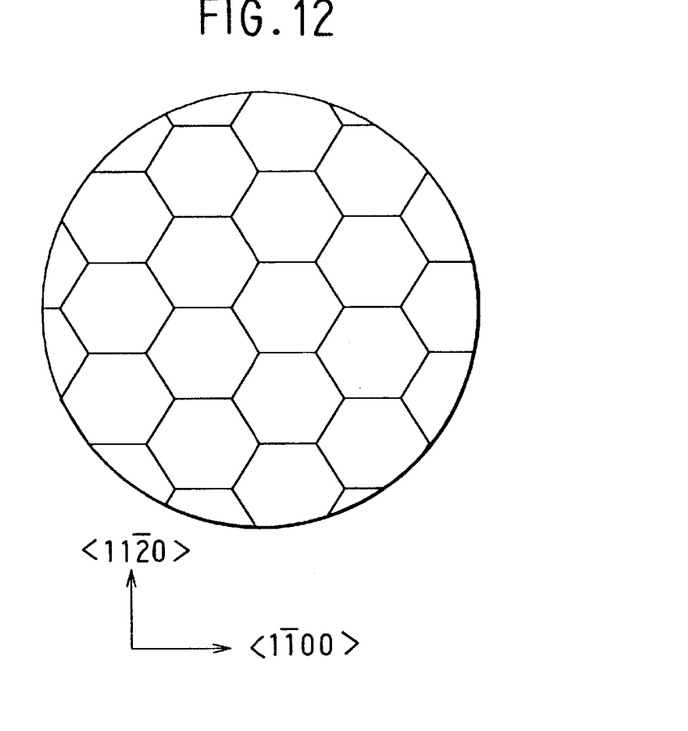
FIG. 12 is a view showing another version of the grooves 4 formed in the surface of the SiC substrate 100.

The shape of the grooves 4 is not limited to the grid form shown in FIG. 2B and can be made the hexagonal shape shown in FIG. 12.

The SiC substrate 100 can have a 6H-type or a 4H-type crystal structure, but experiments carried out by the present inventors have confirmed that the warp-straightening effect is greater with the 4H-type than with the 6H-type.

A second preferred embodiment of the invention will now be described.

In the trench gate type SiC power MOSFET shown in FIG. 13, because the n$^+$ source region 5 is in ohmic contact with the source electrode layer 10, it is preferably as low-resistance as possible and therefore it is necessary for its carrier density to be made high.

According to studies carried out by the present inventors, the n$^+$ source region 5 can be formed by ion-implanting N$^+$ as a dopant into the SiC substrate 100 and then carrying out activation annealing in a vacuum or in an Ar atmosphere with the temperature of the SiC substrate 100, i.e. the substrate temperature, brought to 1300° C. The reason for bringing the substrate temperature to 1300° C. is that when it is brought to a higher temperature than that the N constituting the ion-implanted impurity and the Si and C constituting the base material diffuse out and it becomes impossible to form a good ohmic contact.

However, when the substrate temperature is kept down to 1300° C. it is not possible to raise the activation rate of the activation annealing and consequently a carrier density sufficient to make the resistance of the n$^+$ source region 5 low cannot be obtained.

In this connection, it is conceivable to form a cap film so that the N constituting the ion-implanted impurity and the Si and C constituting the base material do not diffuse out. As a result, the carrier density can be increased by raising the activation rate of the activation annealing by increasing the substrate temperature to above 1300° C. For example, a cap film of SiN or SiO$_2$ of the kind used in activation annealing of Si substrates could be formed.

However, because when this kind of cap film is raised to 1200° C. to 1300° C. or over the cap film decomposes (tears and breaks up) it cannot be used as a cap film on a SiC substrate.

It is therefore an object of this second preferred embodiment of the invention to form a cap film preventing out diffusion in the activation annealing following ion implantation into the SiC substrate and thereby make it possible to obtain a sufficient carrier density.

A method for manufacturing a trench gate type SiC power MOSFET according to a second preferred embodiment of the invention will now be described.

First, the SiC substrate 100 having had its warp straightened by heat treatment shown in FIG. 3 is prepared.

Figure 14A:
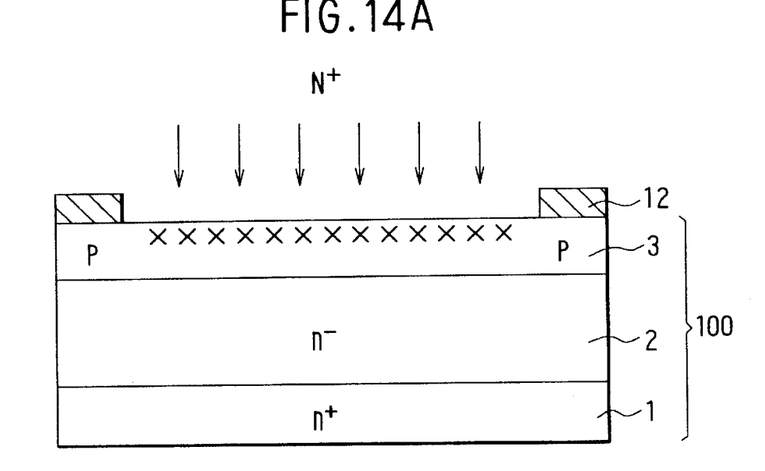
FIGS. 14A through 14C are sectional views illustrating a step of forming an $n^+$ source region 5 at the surface of a SiC substrate 100 in a method for manufacturing a trench gate type SiC power MOSFET according to a second preferred embodiment of the present invention.

Then, as shown in FIG. 14A, an oxide film is deposited and patterned to form a mask 12. After that, the substrate temperature is raised to above 700° C. and N$^+$ is ion-implanted as a dopant.

Figure 14B:
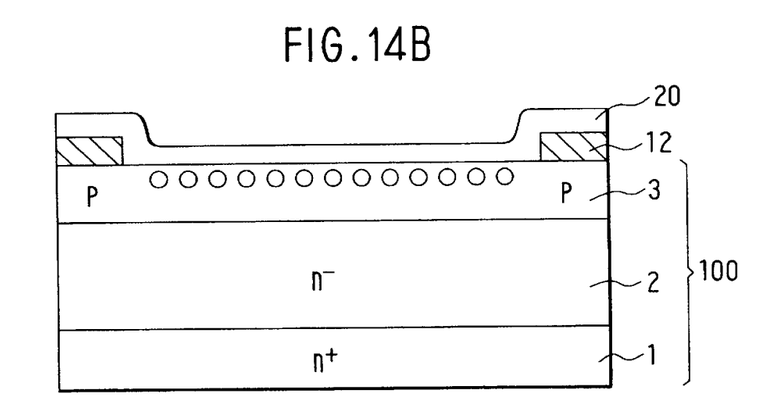

Next, as shown in FIG. 14B, the SiC substrate 100 is disposed in an LP-CVD reactor and heated to 1500° C., and SiH$_4$, C$_3$H$_8$ and a carrier gas (H$_2$) are passed over it to grow an epitaxial film 20 of SiC on the substrate surface. This epitaxial film 20 functions as a cap film preventing out diffusion of the N constituting the ion-implanted impurity and the Si and C of the base material. The epitaxial film 20 is deposited for about ten seconds, and during that time the substrate temperature is held at 1500° C. and the N constituting the ion-implanted impurity is activated. The 'X' symbols in FIG. 14A show the state before the N constituting the impurity is activated and the 'O' symbols in FIG. 14B show the state after the N constituting the impurity is activated. The substrate temperature is then lowered and the SiC substrate 100 is removed from the LP-CVD reactor.

Figure 14C:
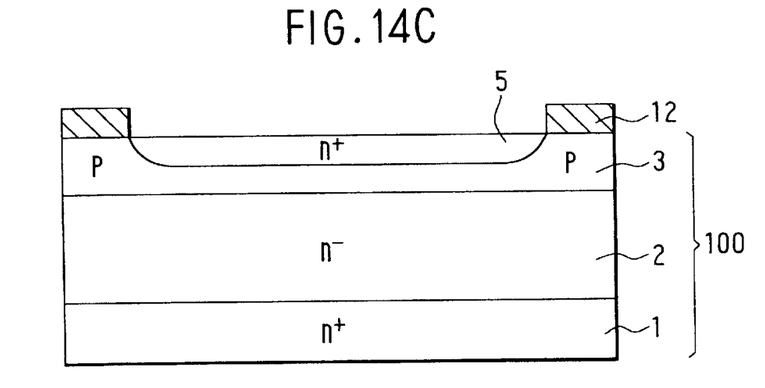

After that, as shown in FIG. 14C, the epitaxial film 20 is removed by dry etching or oxidation and the state shown in FIG. 4 is obtained. Then, the steps of FIG. 5 onward are carried out to complete the trench gate type SiC power MOSFET shown in FIG. 13.

As the film thickness of the epitaxial film 20, 2000 Å to 3000 Å is preferable. This is because when the film thickness is too low, out diffusion is not adequately prevented, and when on the other hand the thickness is too high the removal of the epitaxial film 20 becomes difficult.

Although a substrate temperature in the step of FIG. 14B of 1500° C. was indicated above, this substrate temperature can be chosen from a preferable range of 1300° C. to 1600° C.

Also, although in the preferred embodiment described above the formation of the epitaxial film 20 and the activation annealing are carried out at the same time, alternatively the epitaxial film 20 may be formed at a low temperature and then the substrate temperature raised to 1500° C. and activation annealing carried out with the epitaxial film 20 as a cap film thereafter.

Also, the semiconductor region formed by ion implantation is not limited to the source region 5 and may be another semiconductor region. For example, it may be the above-mentioned guard ring formed around the cell region of the MOSFET.

In the second preferred embodiment described above, a SiC substrate 100 having had its warp straightened by the heat treatment described in the first preferred embodiment was used. However, a SiC substrate on which such heat treatment has not been carried out may alternatively be used. In this case also it is possible to achieve the object of increasing the carrier density of the n$^+$ source region 5.

The first and second preferred embodiments described above are not limited to trench gate type SiC power MOSFET manufacturing methods and can be applied as manufacturing methods of other SiC semiconductor devices wherein a semiconductor region is formed by implanting ions into a SiC substrate.

What is claimed is:

1. A semiconductor substrate comprising:
   a semiconductor layer;
   an epitaxial layer formed on said semiconductor layer; and
   a groove formed in a surface of said epitaxial layer, wherein said semiconductor substrate having said groove is subject to heat treatment to straighten warp of said semiconductor substrate caused at a time of formation of said epitaxial layer.

2. A semiconductor substrate according to claim 1, wherein multiple grooves are formed in said surface of said epitaxial layer.

3. A silicon carbide substrate comprising:
   a silicon carbide semiconductor layer;
   an epitaxial layer whose surface plane orientation is about (000$\bar{1}$) carbon face, formed on said silicon carbide semiconductor layer; and
   a groove formed in a surface of said epitaxial layer, wherein said silicon carbide substrate having said groove is subject to heat treatment to straighten warp of said silicon carbide substrate caused at a time of formation of said epitaxial layer.

4. A silicon carbide substrate according to claim 3, wherein said groove is made in a rectangular grid formed in directions <1$\bar{1}$000> and <11$\bar{2}$0>.

5. A silicon carbide substrate according to claim 3, wherein said groove is made hexagonal.

6. A silicon carbide substrate according to claim 3, wherein said silicon carbide semiconductor layer and said epitaxial layer have a 4H-type crystalline structure.

7. A silicon carbide substrate comprising:
   a silicon carbide semiconductor layer of a first conductive type;
   a first conductive type epitaxial layer formed on said silicon carbide semiconductor layer;
   a second conductive type epitaxial layer formed on said first conductive type epitaxial layer, surface plane orientation of said second conductive type epitaxial layer being about (000$\bar{1}$) carbon face; and
   a groove formed in a surface of said second conductive type epitaxial layer, wherein said silicon carbide substrate having said groove is subject to heat treatment to straighten warp of said silicon carbide substrate.

8. A silicon carbide substrate according to claim 7, wherein said groove is made of a depth such that said groove passes through said second conductive type epitaxial layer and reaches said first conductive type epitaxial layer.

9. A silicon carbide substrate according to claim 7 further comprising:
   a first conductivity type semiconductor region formed in a predetermined area of a surface of said second conductive type epitaxial layer by performing ion-implantation of a dopant into said second conductive type epitaxial layer, forming an epitaxial film on the surface of said second conductive type epitaxial layer and carrying out activation annealing with said epitaxial film as a cap film.

\* \* \* \* \*